(12) United States Patent
Fillion et al.

(10) Patent No.: US 9,988,750 B2
(45) Date of Patent: Jun. 5, 2018

(54) METHOD OF FABRICATING A COMPOSITE MATERIAL PART WITH IMPROVED INTRA-YARN DENSIFICATION

(71) Applicant: HERAKLES, Le Haillan (FR)

(72) Inventors: Arnaud Fillion, Blanquefort (FR); Eric Philippe, Merignac (FR); Francois Charleux, Bordeaux (FR); Eric Bouillon, Le Haillan (FR)

(73) Assignee: HERAKLES, Le Haillan (FR)

( * ) Notice: Subject to any disclaimer, the term of this patent is extended or adjusted under 35 U.S.C. 154(b) by 0 days. days.

(21) Appl. No.: 14/395,118

(22) PCT Filed: Apr. 11, 2013

(86) PCT No.: PCT/FR2013/050790
§ 371 (c)(1),
(2) Date: Oct. 17, 2014

(87) PCT Pub. No.: WO2013/156712
PCT Pub. Date: Oct. 24, 2013

(65) Prior Publication Data
US 2015/0082589 A1 Mar. 26, 2015

(30) Foreign Application Priority Data
Apr. 17, 2012 (FR) .................................. 12 53520

(51) Int. Cl.
*C23C 16/02* (2006.01)
*D06C 21/00* (2006.01)
(Continued)

(52) U.S. Cl.
CPC .............. *D06C 21/00* (2013.01); *B32B 18/00* (2013.01); *C04B 35/571* (2013.01);
(Continued)

(58) Field of Classification Search
CPC ....................................................... C23C 16/02
(Continued)

(56) References Cited

U.S. PATENT DOCUMENTS

| 4,752,503 A | | 6/1988 | Thebault |
| 5,217,796 A | * | 6/1993 | Kasai ..................... D06C 29/00 428/408 |
| 5,486,379 A | * | 1/1996 | Bouillon ................. C04B 35/80 264/129 |
| 5,557,831 A | | 9/1996 | Kishi et al. |
| 6,557,223 B2 | * | 5/2003 | Greenway .............. D04H 18/04 28/104 |
| 6,585,842 B1 | * | 7/2003 | Bompard .............. B29C 70/202 156/166 |
| 7,101,154 B2 | | 9/2006 | Dambrine et al. |
| 7,241,112 B2 | | 7/2007 | Dambrine et al. |
| 7,926,761 B2 | | 4/2011 | Coupe et al. |
| 8,685,868 B2 | | 4/2014 | Bouillon et al. |

(Continued)

FOREIGN PATENT DOCUMENTS

| EP | 0207422 A2 | 1/1987 |
| FR | 2952025 A1 | 5/2011 |

(Continued)

OTHER PUBLICATIONS

International Search Report for corresponding International PCT Application No. PCT/FR2013/050790, dated Jun. 4, 2013.

*Primary Examiner* — Elizabeth A Burkhart
(74) *Attorney, Agent, or Firm* — Workman Nydegger (57) ABSTRACT

A method of fabricating a composite material part comprises fiber reinforcement densified by a matrix. The method comprises the following steps: making a fiber fabric by weaving yarns having an initial mean fiber percentage; and densifying the fiber fabric with a matrix. The fiber fabric is subjected, prior to densification, to one or more jets of water under pressure so as to reduce the mean fiber percentage in the fabric to a value lying in the range 20% to 45%.

23 Claims, 3 Drawing Sheets

(51) Int. Cl.
*C04B 35/628* (2006.01)
*D06C 29/00* (2006.01)
*C04B 35/571* (2006.01)
*B32B 18/00* (2006.01)
*D03D 25/00* (2006.01)

(52) U.S. Cl.
CPC ........ *C04B 35/62873* (2013.01); *C23C 16/02* (2013.01); *D03D 25/005* (2013.01); *D06C 29/00* (2013.01); *C04B 2235/5244* (2013.01); *C04B 2235/5248* (2013.01); *C04B 2235/5252* (2013.01); *C04B 2235/5256* (2013.01); *C04B 2235/5268* (2013.01); *C04B 2235/614* (2013.01); *C04B 2235/616* (2013.01); *C04B 2237/365* (2013.01); *C04B 2237/38* (2013.01); *C04B 2237/584* (2013.01)

(58) Field of Classification Search
USPC ...................................... 427/249.2
See application file for complete search history.

(56) References Cited

U.S. PATENT DOCUMENTS

| | | |
|---|---|---|
| 2007/0007386 A1 | 1/2007 | Coupe et al. |
| 2010/0015428 A1* | 1/2010 | Philippe ................ C04B 35/571 428/293.4 |
| 2010/0144227 A1 | 6/2010 | Coupe et al. |
| 2011/0311368 A1 | 12/2011 | Coupe et al. |
| 2012/0301691 A1 | 11/2012 | Charleux et al. |

FOREIGN PATENT DOCUMENTS

| | | |
|---|---|---|
| WO | 2000075410 A1 | 12/2000 |
| WO | 2006136755 A2 | 12/2006 |
| WO | 2010061140 A1 | 6/2010 |

* cited by examiner

METHOD OF FABRICATING A COMPOSITE MATERIAL PART WITH IMPROVED INTRA-YARN DENSIFICATION

BACKGROUND OF THE INVENTION

The present invention relates to a method of fabricating a composite material part comprising fiber reinforcement densified by a matrix.

More particularly, but not exclusively, the field of application of the invention relates to thermostructural composite materials, i.e. to composite materials having good mechanical properties and a capacity for conserving these properties at high temperatures. Typical thermostructural materials are carbon/carbon (C/C) composite materials formed by carbon fiber reinforcement densified by a carbon matrix, and ceramic matrix composite (CMC) materials formed by refractory fiber reinforcement (carbon fibers or ceramic fibers) densified by a matrix that is at least partially ceramic. Examples of CMCs are C/SiC composites (carbon fiber reinforcement and silicon carbide matrix), C/C—SiC composites (carbon fiber reinforcement and matrix comprising a carbon phase, generally next to the fibers, and a silicon carbide phase), and SiC/SiC composites (reinforcing fibers and matrix made of silicon carbide). An interphase layer may be interposed between the reinforcing fibers and the matrix in order to improve the mechanical strength of the material.

Fabricating a thermostructural composite material part generally comprises making a fiber preform of shape close to the shape of the part that is to be fabricated, and densifying the preform with the matrix.

The fiber preform constitutes the reinforcement of the part and it performs a role that is essential in terms of mechanical properties. The preform is obtained using fiber fabrics: yarns, tows, braids, woven cloth, felts, . . . . Shaping is performed by winding, weaving, stacking, and possibly needling two-dimensional plies of cloth or of sheets of tows.

Densifying the fiber preform consists in filling in the pores in the preform throughout all or some of its volume, using the material that constitutes the matrix.

The matrix of a composite material may be obtained by using various known methods and in particular by using a liquid technique or using a gaseous technique.

The method using a liquid technique consists in impregnating the preform with a liquid composition containing an organic precursor for the material of the matrix. The organic precursor is usually in the form of a polymer, such as a resin, and it is optionally diluted in a solvent. The precursor is transformed into a refractory phase by heat treatment, after eliminating any solvent and after curing the polymer. The heat treatment consists in pyrolyzing the organic precursor in order to transform the organic matrix into a matrix of carbon or of ceramic depending on the precursor used and on pyrolysis conditions. By way of example, liquid precursors for carbon may be resins having a relatively high coke content, such as phenolic resins, whereas liquid precursors for ceramic, in particular for SiC, may be resins of the polycarbosilane (PCS) type, of the polysiloxane (PSX) type, of the polytitanocarbosilane (PTCS) type, or of the polysilazane (PSZ) type. A plurality of consecutive cycles running from impregnation to heat treatment may be performed in order to achieve the desired degree of densification.

The method using a gaseous technique consists in chemical vapor infiltration (CVI). The fiber preform is placed in an oven into which a reaction gas phase is admitted. The pressure and the temperature that exist in the oven and the composition of the gas phase are selected so as to enable the gas phase to diffuse within the pores of the preform in order to form the matrix therein by depositing solid material, in contact with the fibers, which solid material results from decomposition of an ingredient of the gaseous phase or from a reaction between a plurality of its ingredients. For example, gaseous precursors for carbon may be hydrocarbons that produce carbon by cracking, such as methane, and a gaseous precursor for ceramic, in particular for SiC, may be methyltricholorosilane (MTS) giving SiC by decomposition of the MTS (possibly in the presence of hydrogen).

In order to obtain good and uniform densification of the fiber preform and thereby confer good mechanical properties to the part, the matrix must be deposited not only in the pores that are present between the yarns of the preform (inter-yarn pores or spaces), but also in the pores that are present within the yarns, i.e. in the pores between the filaments of a given yarn (intra-yarn pores or spaces).

Nevertheless, it is often difficult to achieve densification to the core of a continuous yarn, whether by a liquid technique or by a gaseous technique, because the mean distance between the fibers in the yarns is too small, and consequently because inter-yarn pores are too small and difficult to access from outside the yarns, in particular when the fabric is made by weaving. Under certain circumstances, too small a quantity of matrix within the yarns can lead to a reduction in the mechanical properties and in the fatigue strength of the material under stress at high temperature.

Document U.S. Pat. No. 5,217,796 describes making printed circuit cards from a fiber fabric constituted by inorganic fibers, e.g. glass fibers, the fabric being reinforced with a resin. In that document, the fabric is subjected to jets of water under pressure in order to open up the yarns that are exposed on the surface of the fabric. Nevertheless, in that document, only the surface yarns are treated and the pressure of the jets of water is adjusted so as to break or cut the yarns at the surface, which cannot be envisaged when fabricating a structural or thermostructural composite material part since it is essential to preserve the integrity and the continuity of the yarns at all points within the fabric in order to avoid damaging the mechanical properties of the part. In addition, the method described in Document U.S. Pat. No. 5,217,796 leads to considerable expansion at the surface of the fabric which is penalizing for infiltrating to the core of the fabric while performing densification by CVI. Under such circumstances, the matrix becomes deposited mainly on the expanded surface of the fabric, thereby rapidly sealing the surface of the fabric and preventing the gas phase from penetrating to the core of the fabric. Having little or no matrix in the core of the fabric means that it is not possible to obtain composite material parts with mechanical properties that are satisfactory.

OBJECT AND SUMMARY OF THE INVENTION

The present invention seeks to remedy the above-mentioned drawbacks and to propose a solution for facilitating and improving intra-yarn densification by means of a matrix in a woven fiber fabric.

To this end, the invention provides a method of fabricating a composite material part comprising fiber reinforcement densified by a matrix, said method comprising the following steps:

making a fiber fabric by weaving yarns, said fiber fabric presenting a determined initial mean fiber percentage; and     densifying the fiber fabric with a matrix;

the method being characterized in that it comprises, prior to densifying the fiber fabric, a step of treating the fabric by subjecting said fabric to one or more jets of water under pressure so as to reduce the mean fiber percentage in the fabric to a value lying in the range 20% to 45%, and in that each water jet is delivered from a nozzle, the pressure of the water jet at the outlet from the nozzle being less than or equal to 100 bars, each nozzle being placed at a distance from the surface of the fiber fabric that is greater than or equal to 50 millimeters (mm).

By reducing the mean fiber percentage in the fiber fabric compared with the initial fiber percentage that the fabric presented after weaving, the mean distance between the fibers of the yarns is increased. Specifically, by treating the fabric with a fluid under pressure prior to densification, the yarns of the fabric are caused to expand. This increases the number and the volume of pores present within the yarns (intra-yarn porosity), thereby enhancing densification of the yarns to the core and improving the mechanical properties and the lifetime of the resulting material.

The fiber percentage in the fabric is reduced by treating it with fluid under pressure in such a manner as to obtain a fiber fabric in which the final mean fiber percentage lies in the range 20% to 45%, thus making it possible to open up the yarns in significant manner for improving infiltration of the yarns to the core without destroying the fiber fabric.

In addition, by limiting the outlet pressure of the jets of water to 100 bars with a minimum distance of 50 mm, it is ensured that the yarns of the fabric are opened up without breaking the yarns present at the surface. Preserving yarn continuity at the surface makes it possible to obtain fiber reinforcement for a composite material part that is suitable for transmitting forces in identical manner throughout the thickness of the fabric, which is not true when the yarns at the surface are broken.

In an aspect of the invention, the fiber fabric is a multi-layer fabric made by three-dimensional weaving of continuous yarns of carbon fibers, of silicon carbide fibers, or of oxide fibers.

The fiber fabric may be densified by using chemical vapor infiltration to deposit a matrix in said fabric, or by depositing a matrix by a liquid technique, or indeed by combining a liquid technique for infiltrating a matrix and chemical vapor infiltration of a matrix within said fabric. Before densification, an interphase layer may be deposited on the fibers of the fiber fabric.

In another aspect of the invention, the matrix is a ceramic matrix selected from at least: an oxide; a nitride; a carbide; and a silicide. In particular, the ceramic matrix may comprise at least silicon carbide and boron or a boron compound.

In yet another aspect of the invention, the method further comprises a step of shaping and consolidating the fiber fabric, which step is performed after the step of treating the fabric with a fluid under pressure and before the step of densifying said fabric.

BRIEF DESCRIPTION OF THE DRAWINGS

Other characteristics and advantages of the invention appear from the following description of particular implementations of the invention given as non-limiting examples and described with reference to the accompanying drawings, in which.

DETAILED DESCRIPTION OF IMPLEMENTATIONS

The present invention proposes a method of fabricating a part out of thermostructural composite material by using a fiber fabric obtained by weaving continuous yarns. In order to improve intra-yarn densification, and consequently improve the mechanical properties of the part, the fabric is subjected to one or more jets of water under pressure prior to densification, thereby expanding the yarns in the woven fabric and increasing the mean distance between the fibers of the yarns. That treatment thus amounts to increasing the thickness of the fabric, thereby reducing the mean fiber percentage in the fabric.

In accordance with the invention, pressurized water jet treatment is performed firstly so as to reduce the mean fiber percentage in the fabric relative to the initial mean percentage, and secondly so as to obtain a final mean fiber percentage in the fabric having a value lying in the range 20% to 45%. For fabrics presenting an initial mean fiber percentage greater than 30%, the pressurized fluid treatment corresponds to reducing that initial percentage to a smaller value.

By way of example, for fibers at an initial mean percentage of 40%, the pressurized fluid treatment is performed so as to reduce that percentage to a value of less than 40%, such as a value in the range 20% to 45%, for example.

For fabrics presenting an initial mean fiber percentage that is greater than 40%, the pressurized fluid treatment corresponds to reducing that initial percentage to a value that is smaller so as to bring the percentage to a value lying in the range 20% to 45%.

In addition, still in accordance with the present invention, the pressure of the water jets at the outlet from the nozzles is at most 100 bars, the nozzle(s) being placed at a distance of at least 50 mm from the exposed surface of the fabric to be treated. These operating conditions serve to ensure that the yarns in the fabric are opened up without rupturing or breaking the yarns present at the surface of the fabric. Preserving yarn continuity at the surface of the fabric makes it possible to obtain a composite material part that presents good mechanical characteristics throughout the thickness of its fiber reinforcement as constituted by the treated fabric.

The method of fabricating a composite material part begins by making a fiber fabric that is obtained by three-dimensionally weaving warp yarns and weft yarns. The term "three-dimensional weaving" or "3D weaving" is used herein to mean a method of weaving in which at least some of the warp yarns interlink weft yarns over a plurality of weft layers. Among the various kinds of three-dimensional weaving that can be used for making the fiber fabric in the present invention, mention is made in particular of interlock weaving and of multilayer weaving. The term "interlock weaving" is used herein to mean a 3D weave in which each warp layer interlinks a plurality of weft layers, with all of the yarns in a given warp column having the same movement in the weave plane. An example of fabric obtained by interlock weaving is a Guipex® fabric or preform. The term "multi-layer weaving" is used herein to mean 3D weaving with a plurality of weft layers in which the base weave for each layer is equivalent to a weave for a conventional 2D cloth, such as a weave of the plain type (multi-plain cloth), or of the satin or twill type (multi-satin or multi-twill cloth), but in which some of the points in the weave interlink weft layers.

Detailed examples of making a fiber fabric or preform by 3D weaving are described in detail in particular in the following Documents U.S. Pat. No. 7,101,154, U.S. Pat. No. 7,241,112, WO 2010/061140, and WO 2006/136755, the content of which is incorporated herein by way of reference.

The yarns used for making the fiber fabric may be made of fibers having a variety of natures, and in particular carbon fibers, ceramic fibers (e.g. silicon carbide fibers), or oxide fibers.

After weaving the fiber fabric and in accordance with the present invention, the fiber fabric is subjected to one or more jets of water under pressure in order to reduce the fiber percentage in the fabric.

Figure 1:
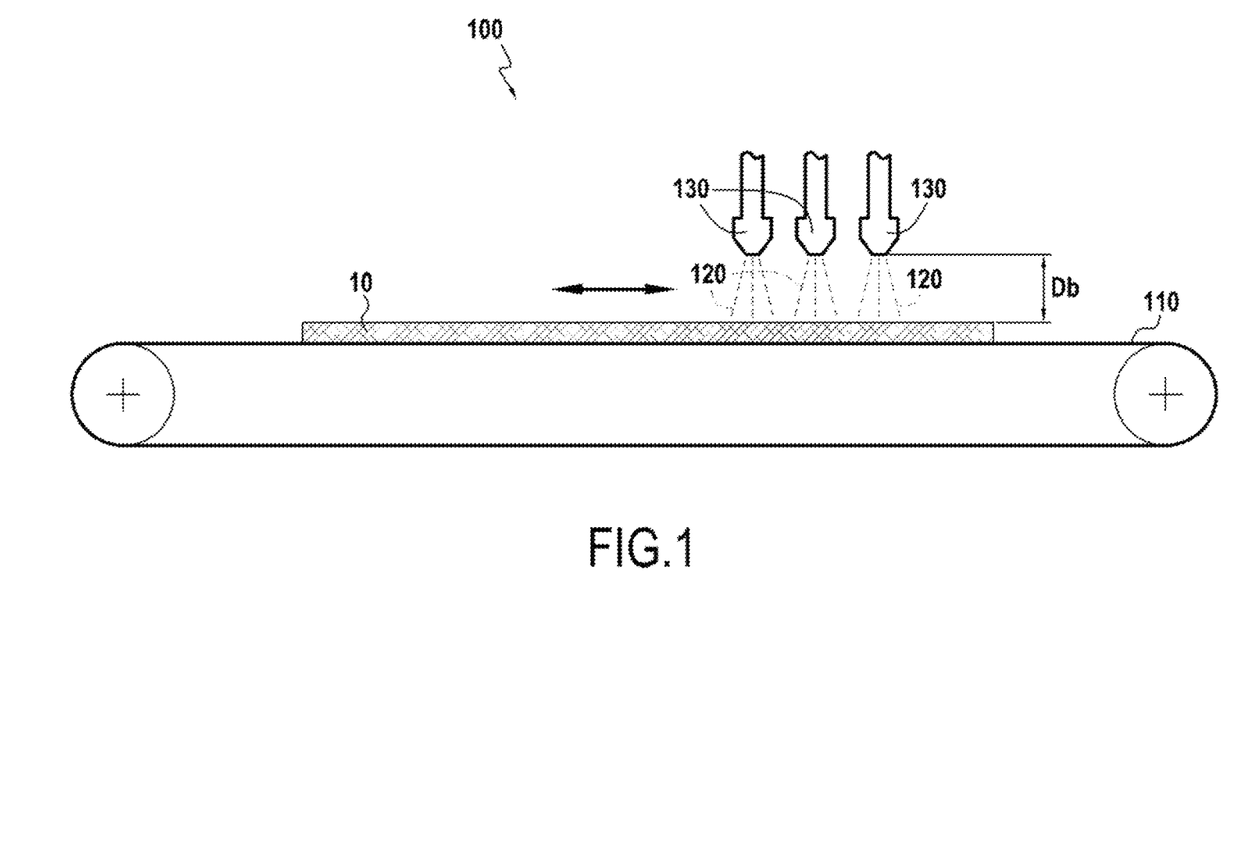
FIG. 1 is a diagrammatic view of an installation for treating a fiber fabric with jets of water under pressure in accordance with the invention.

FIG. 1 shows an installation 100 for performing such treatment. The installation 100 comprises a belt 110 carrying a fiber fabric 10 that is to be subjected to jets of water under pressure 120 delivered by nozzles 130 positioned over the path of the belt 110. During operation of the installation, the fiber fabric may be passed one or more times under the jets of water under pressure 120. The fabric may have a different orientation on each pass in order to make the effects of the jets of water more uniform over all of the yarns in the fabric. For example, the fabric may be turned through 45° or 90° before each new pass. The fabric may also be turned over after one or more passes under the jets of water under pressure 120 so as to subject both faces of the fabric to the jets of water under pressure. This makes it possible in particular to reach all of the layers of yarns if the fabric is thick.

The pressure of the jets of water at the outlet from the nozzle is adjusted so as to reduce the fiber percentage in the fabric to a value lying in the range 20% to 45%, as explained above. The pressure to be adjusted depends mainly on the thickness of the fiber fabric for treatment and on the distance Db between the nozzles 130 and the fabric 10. To a smaller extent, the pressure is also adjusted as a function of the shape of the jet leaving the nozzle. For example, the pressure should be adjusted to be stronger for a jet that is very dispersed on leaving the nozzle than for a jet that is more concentrated on leaving the nozzle.

By way of example, for a 3D woven fiber fabric, such as a Guipex® fabric, with thickness lying in the range 1 mm to 2 mm and being subjected to jets of water under pressure in a PERFOJET JETLACE 3000 installation in which the nozzles are situated at a distance of 50 mm from the exposed face of the fiber fabric, the pressure of the water jets at the outlets of the nozzles is adjusted to about 80 bars.

In addition to the step of making a fiber fabric and treating it with a fluid under pressure as described above, the method of fabricating a composite material part in accordance with the invention includes the well-known step of shaping and consolidating the fabric by a liquid technique in order to obtain a consolidated preform, and densifying the preform by a gaseous technique and/or a liquid technique.

Prior to the consolidation and densification steps, it is optionally possible to perform a step of depositing an interphase layer, as described in Documents U.S. Pat. No. 4,752,503 and U.S. Pat. No. 5,486,379.

In well-known manner, consolidation by a liquid technique is performed by impregnating the fiber fabric with an organic precursor of the material desired for the first phase of the matrix used for consolidation. These may be precursors for ceramics such as polycarbosilanes (PCS), polysiloxanes (PSX), polytitanocarbosilanes (PTCS), or polysilazanes (PSZ), or precursors for carbon (phenolic resin, furan resin, pitch, etc.).

The fiber fabric is generally shaped by molding before or after impregnating the fiber fabric with the consolidation composition. The impregnated fiber fabric is polymerized, generally at a temperature lower than 400° C. At this stage, the shaped fabric is subjected to heat treatment for transforming the precursor by pyrolysis. This treatment is performed at a temperature that generally lies in the range 500° C. to 2800° C., depending on the nature of the precursor, with the fabric optionally being held in the mold in order to avoid deformation.

Densification by a gaseous technique is performed by CVI in an infiltration oven into which a gas phase is admitted that generally contains gaseous precursors for ceramic, in particular for silicon carbide (SiC) or for carbon. Gaseous techniques for forming matrices are well known.

Figure 2:
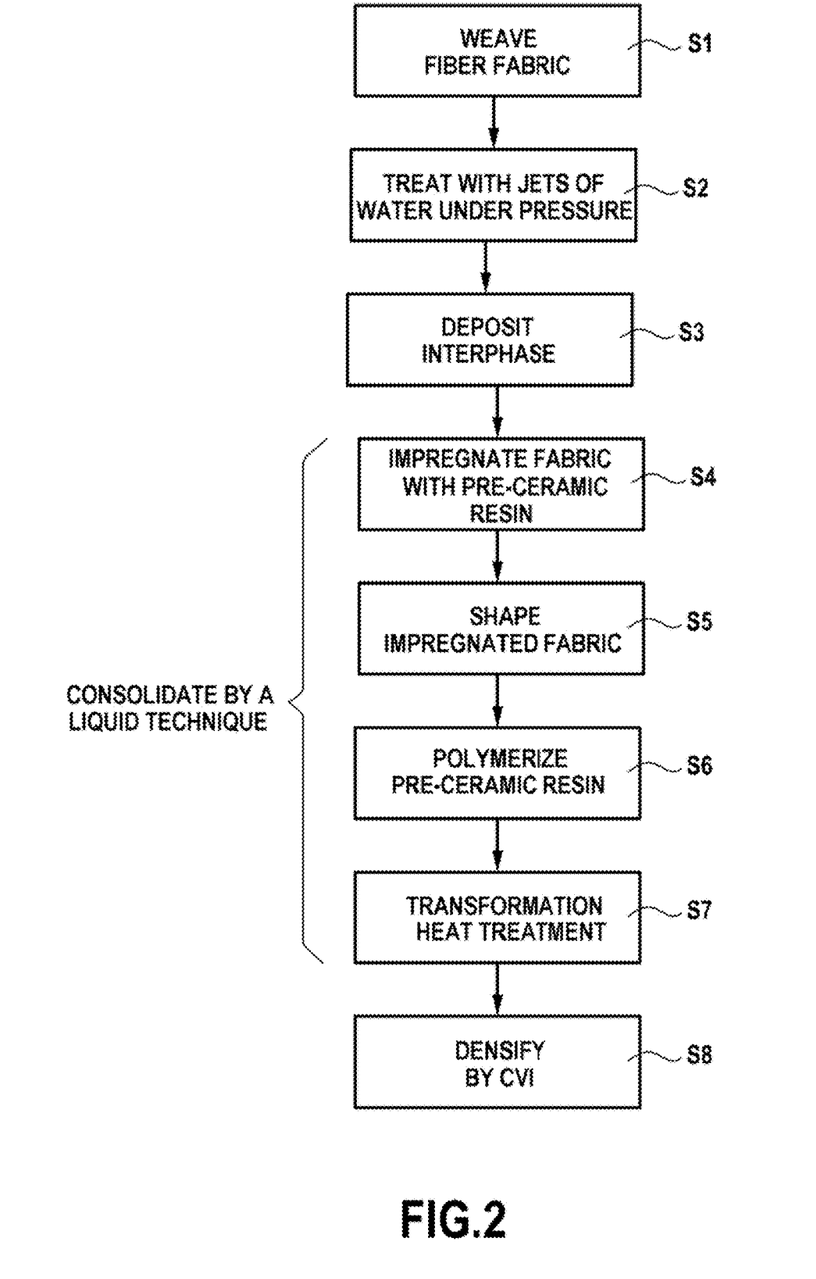
FIG. 2 is a flow chart showing successive steps of an implementation of a method in accordance with the invention.

With reference to FIG. 2, there follows a description of an implementation of a method of fabricating a part out of thermostructural composite material in accordance with the invention in which the fiber fabric, after being made by weaving and before being consolidated and densified, is subjected to one or more jets of water under pressure.

The first step (step S1) consists in weaving a fiber fabric by 3D weaving of yarns made of ceramic fibers, e.g. yarns of SiC fiber of the ZMI® or Nicalon® type.

There then follows a step (step S2) of subjecting the fiber fabric to treatment by jet(s) of water under pressure, as described above, i.e. under operating conditions that enable the fiber percentage in the fabric to be reduced to a value lying in the range 20% to 45%, thus facilitating infiltration of the yarns by the matrix that is deposited subsequently.

In the presently-described example, an interface layer is deposited on the fibers of the fiber fabric in order to improve the mechanical strength of the material (step S3).

The fiber fabric is then impregnated with a liquid consolidation composition, in this example a resin that is a precursor for silicon carbide, which resin may optionally be diluted in a solvent, e.g. acetone (step S4). After optional steps of evaporating the solvent and of pre-polymerization (pre-nucleation), the impregnated fiber fabric is shaped by molding (step S5), and the resin is polymerized (step S6). The fabric is then subjected to heat treatment in order to transform the resin by pyrolysis into a solid SiC residue that serves to consolidate the fabric and to obtain a fiber preform that keeps its shape (a self-supporting preform) (step S7).

At this stage in the method, the preform is sufficiently rigid to be placed in an oven for densification by chemical vapor infiltration without having recourse to tooling (step S8). Depending on the nature of the gas phase introduced into the oven, a matrix of ceramic or of carbon is formed within the fiber fabric. Since the internal pores in the yarns have already been opened by the pressurized fluid treatment, the gas phase penetrates not only into spaces between yarns but also into the pores within the yarns, thereby making it possible to form a matrix by a gaseous technique both outside and inside the yarns of the preform.

The thermomechanical properties of the composite material part as made in this way are better than those of a part made in similar manner but without previously subjecting the fiber fabric to jets of water under pressure.

Figure 3:
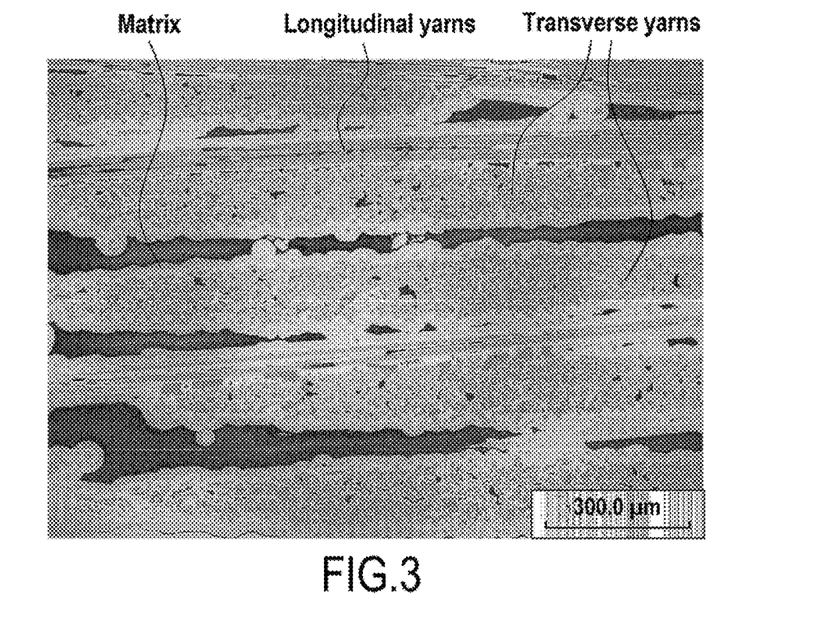
FIGS. 3 and 4 are microphotographs showing a composite material obtained respectively using a prior art method of fabrication and a method of fabrication of the invention.
Figure 4:
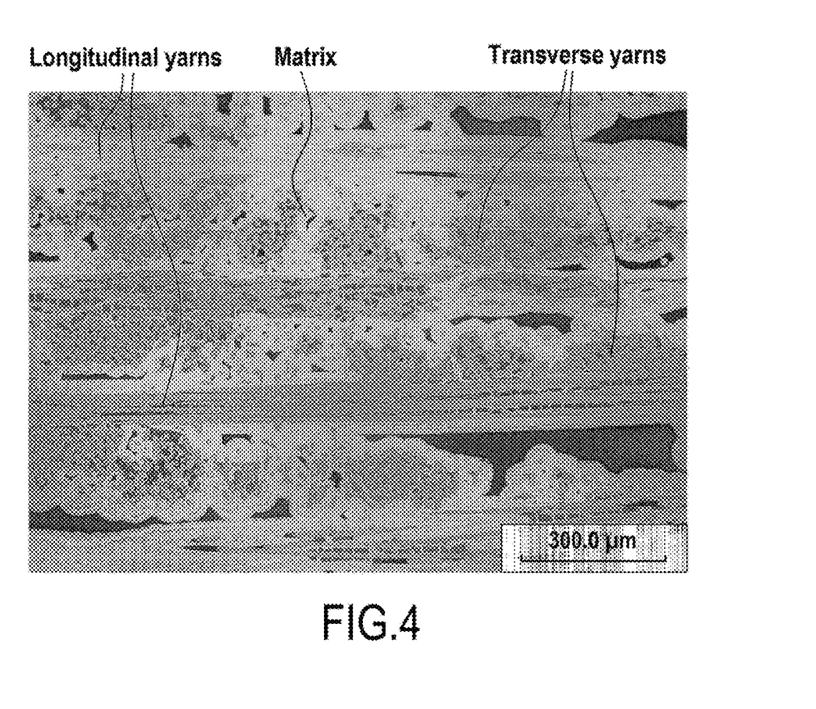

FIG. 3 shows a CMC material after using a gaseous technique to densify a fiber fabric made of SiC fibers that was not subjected prior to densification to jets of water under pressure, while FIG. 4 shows a CMC material after using a gaseous technique to densify a fiber fabric that was subjected to jets of water under pressure in accordance with the invention.

The composite material of FIGS. 3 and 4 is a CMC material made under the following conditions:
- forming a fiber fabric corresponding to a Guipex® cloth having a thickness of 1 mm by making a multilayer structure by three-dimensionally weaving yarns of ZMI® SiC fibers;
- depositing an interphase;
- using a liquid technique to consolidate the fabric by impregnating it in a bath of pre-ceramic resin, and then polymerizing and pyrolyzing the resin; and
- using a gaseous technique (CVI) to densify the fabric with an SiC matrix.

For the material in FIG. 4, both faces of the fiber fabric were also previously subjected to two passes under jets of water under pressure in a PERFOJET JETLACE 3000 installation, with the pressure of the water jets being 80 bars and with the nozzles being situated at a distance of 50 mm from the exposed surface of the fabric. In this example, the jets of water under pressure were delivered by nozzles, each having 15 holes, each with an outlet diameter of 0.127 mm.

In FIG. 4 (microphotograph of the material obtained with the fabric treated using jets of water under pressure), it can be seen that the yarns of the fabric have expanded/opened and it can be seen that the matrix is present both in spaces between yarns and in spaces as created in this way within yarns, whereas in FIG. 3 (microphotograph of the material obtained with a fabric that was not treated with jets of water under pressure), there can be seen no expansion up or opening of the yarns of the fabric, so the matrix is located essentially outside the yarns, i.e. in the spaces between the yarns.

In addition, by comparing the materials of FIGS. 3 and 4, it can be seen that the fibers are more uniformly distributed in a fabric that has previously been treated with jets of water under pressure (FIG. 4) as compared with one that has not (FIG. 3). Reducing the fiber percentage in a given volume with a fluid under pressure causes the yarns in the fabric to bulk up and to distribute the fibers within the spaces between yarns that were not occupied by the yarns originally.

Table I below gives the results of reducing the fiber percentage as obtained by treating a fiber fabric (Guipex® cloth) with jets of water using the same installation as that used for treating the fabrics of the material in FIG. 4, the fabric being subjected to a jet of water under pressure at a determined pressure and on one or both faces consecutively, as specified in the second column of the table.

TABLE I

| Fiber | Water jet pressure (bars) | Initial fiber percentage | Initial fabric thickness (mm at 5 kPa) | Fiber percentage after water jet treatment | Fabric thickness (mm at 5 kPa) after water jet treatment |
|---|---|---|---|---|---|
| ZMI® | 30 (1 face) | 57.6 | 1.075 | 53.6 | 1.16 |
|  | 30 (1 face) | 57.6 | 1.075 | 53.6 | 1.16 |
|  | 80 (2 faces) | 57.6 | 1.075 | 34.5 | 1.22 |
|  | 80 (2 faces) | 57.6 | 1.075 | 34.5 | 1.45 |
|  | 80 (2 faces) | 57.6 | 1.075 | 34.5 | 1.51 |
|  | 30 to 120 (1 face) | 57.6 | 1.075 | 27.7 | 1.79 |
|  | 30 to 120 (1 face) | 57.6 | 1.075 | 27.7 | 1.52 |

In the above table, the fiber fabrics made from ZMI® fibers present a weight per unit area of 955 grams per square meter (g/m$^2$). Certain fabrics were tested several times under the same treatment conditions in order to demonstrate that the method of the invention is reproducible.

Fiber percentage in a fiber fabric (initial or after water jet treatment) is calculated on the basis of the weight per unit area of the fabric, the density of the fibers, i.e. their weight per unit volume, and the thickness of the fabric, using the following formula:

$$\text{Fiber percentage} = \frac{\text{weight per unit area}}{\text{fiber density} \times \text{fabric thickness}}$$

Comparative lifetime tests have been performed with testpieces made of CMC composite material using identical Guipex® woven fiber fabrics (i.e. having the same weave and the same thickness), that were consolidated using a liquid technique with a pre-ceramic resin and densified using a gaseous technique (CVI). The fiber fabric of the first testpiece was made using ZMI® type SiC fibers and it was not treated with jets of water under pressure prior to densification. The fiber fabric of the second testpiece was likewise made using ZMI® type SiC fibers but, prior to consolidation and densification, it was subjected to jets of water under a pressure of 80 bars over both of its faces consecutively. The two testpieces were evaluated for creep under the same conditions, namely at a temperature of 450° C. and under a load of 2640 newtons (N). The lifetime of the first testpiece (without prior treatment of the fiber fabric with jets of water) was 310 hours (h), whereas the lifetime of the second testpiece (fiber fabric treated with jets of water) was 520 h, thereby demonstrating the positive influence of treatment with jets of water under pressure on the lifetime of the material.

The person skilled in the art can adapt operating conditions, in particular the pressure of the jet(s) of water, as a function of the nature thereof and as a function of other parameters described above (distance between the nozzle(s) and the fabric, thickness of the fabric, etc.). Operating conditions may be adapted in particular after performing several tests in order to obtain the desired reduction in the fiber percentage in the fabric, i.e. in accordance with the invention a reduction of the initial mean fiber percentage in the fabric to a value lying in the range 20% to 45%.

The invention claimed is:

1. A method of fabricating a thermostructural composite material part comprising fiber reinforcement densified by a matrix, said method comprising the following steps:
    providing a fiber fabric of three-dimensionally woven warp yarns and weft yarns in which at least some of the warp yarns interlink weft yarns over a plurality of weft layers, said fiber fabric having a determined initial mean fiber percentage;
    reducing a mean fiber percentage in the fiber fabric to a value lying in the range 20% to 45% by subjecting said fiber fabric to one or more water jets under pressure, each of the one or more water jets being delivered from a corresponding nozzle;

densifying the fiber fabric with a matrix;

wherein the step of reducing the mean fiber percentage in the fiber fabric is performed prior to densifying the fiber fabric, wherein, in the step of reducing the mean fiber percentage, the pressure of each of the one or more water jets at the outlet from each of the one or more nozzles is less than or equal to 100 bars, wherein each of the one or more nozzles is at a distance from the surface of the fiber fabric that is greater than or equal to 50 mm, and wherein densification of the fiber fabric includes chemical vapor infiltration (CVI) of the matrix into said fiber fabric.

2. A method according to claim 1, wherein the fiber fabric is a multilayer fabric made by three-dimensional weaving of continuous yarns of carbon fibers, of silicon carbide fibers, or of oxide fibers.

3. A method according to claim 1, wherein it comprises, prior to densifying the fiber fabric, depositing an interphase on the fibers of said fiber fabric.

4. A method according to claim 1, wherein densifying the fiber fabric comprises using a liquid technique to infiltrate a matrix into said fiber fabric.

5. A method according to claim 1, wherein the matrix is a ceramic matrix selected from the group consisting: an oxide; a nitride; a carbide; and a silicide.

6. A method according to claim 5, wherein the ceramic matrix comprises at least silicon carbide and boron or a boron compound.

7. A method according to claim 1, further comprising a step of shaping and consolidating the fiber fabric after the step of reducing the mean fiber percentage in the fiber fabric and before the step of densifying said fiber fabric.

8. A method according to claim 1, wherein the pressure of the water jet at the outlet of each of the one or more nozzles is about 80 bars.

9. A method according to claim 1, wherein the nozzle have an outlet diameter of about 0.127 mm.

10. A method according to claim 1, wherein the fiber fabric has a thickness in the range of 1 mm to 2 mm before treating the fiber fabric by subjecting the fiber fabric to the one or more jets of water under pressure.

11. A method according to claim 1, further comprising a step of impregnating the fiber fabric with a liquid consolidation composition.

12. A method according to claim 11, wherein the liquid consolidation composition is a resin that is a precursor for silicon carbide.

13. A method according to claim 11, further comprising a step of shaping the impregnated fiber fabric by molding.

14. A method according to claim 13, further comprising a step of subjecting the shaped the fiber fabric to a heat treatment, after the fiber fabric has been shaped.

15. A method according to claim 14, wherein the step of densifying the fiber fabric is performed by chemical vapor infiltration, after the fiber fabric has been shaped.

16. The method according to claim 1, wherein the mean fiber percentage in the fiber fabric is calculated on a basis of a weight per unit area of the fiber fabric, a density of the fibers of the fiber fabric, and a thickness of the fiber fabric, based on the formula:

$$\text{Fiber percentage} = \frac{\text{weight per unit area}}{\text{fiber density} \times \text{fabric thickness}}.$$

17. The method according to claim 1, wherein the step of reducing the mean fiber percentage in the fiber fabric includes subjecting a first face of said fiber fabric with water under said pressure, and subjecting a second face of said fiber fabric with water under said pressure.

18. The method according to claim 1, wherein the step of reducing the mean fiber percentage in the fiber fabric includes subjecting said fiber fabric with said one or more jets of water under pressure in a first pass, and subsequently subjecting said fiber fabric with said one or more jets of water under pressure in a second pass.

19. The method according to claim 1, wherein the step of densifying the fiber fabric includes depositing the matrix in both inter-yarn pores present between the woven yarns of the fiber fabric and within intra-yarn pores formed between filaments of each of the woven yards, the intra-yarn pores being made available for deposition of the matrix within the intra-yarn pores by the step of reducing the mean fiber percentage in the fiber fabric.

20. The method according to claim 1, wherein, in the step of reducing mean fiber percentage in the fiber fabric, yarns present at a surface of the fiber fabric subjected to the one or more jets of fluid are essentially preserved without breaking.

21. The method according to claim 1, wherein the water pressure at each of the one or more nozzles is less than 100 bars.

22. A method of fabricating a thermostructural composite material, said method comprising the steps:

providing a fiber fabric with three-dimensionally woven warp yarns and weft yarns in which at least some of the warp yarns interlink weft yarns over a plurality of weft layers, said fiber fabric having a determined initial mean fiber percentage;

reducing the mean fiber percentage in the fiber fabric to a value lying in a range of 20% to 45%; and densifying the fiber fabric with a matrix, wherein said step of reducing the mean fiber percentage is performed before the step of densifying the fiber fabric with the matrix, wherein, in the step of reducing the mean fiber percentage in the fiber fabric, a first face of the fiber fabric is subjected to one or more jets of water under pressure, each of the one or more jets of water being delivered from a corresponding nozzle, and a second face of the fiber fabric is subjected to said one or more jets of water under pressure, and wherein densification of the fiber fabric includes chemical vapor infiltration (CVI) of the matrix into said fiber fabric.

23. A method of fabricating a thermostructural composite material, said method comprising the steps:

providing a fiber fabric comprised of three-dimensionally woven warp yarns and weft yarns in which at least some of the warp yarns interlink weft yarns over a plurality of weft layers, said fiber fabric having a determined initial mean fiber percentage;

increasing the intra-yarn porosity of the woven yarns by increasing the number and the volume of internal pores present within each of the woven yarns such that the mean fiber percentage in the fiber fabric is reduced to a value lying in a range of 20% to 45%; and densifying the fiber fabric with a matrix, wherein said step of reducing the mean fiber percentage is performed before the step of densifying the fiber fabric with the matrix, in the step of increasing the intra-yarn porosity, the mean fiber percentage in the fiber fabric is reduced by subjecting said fiber fabric with one or more jets of fluid under pressure, each of the one or more jets of fluid being delivered from a corresponding nozzle, the pressure of each of the jets of fluid at the outlet from each of the one or more nozzles is less than or equal to 100 bars, each of the one or more nozzles is placed at a distance from the surface of the fiber fabric that is greater than or equal to 50 mm during the step of reducing the mean fiber percentage in the fiber fabric, the step of increasing the intra-yarn porosity of the woven yarns is performed without substantially breaking yarns present at a surface of the fiber fabric subjected to the one or more jets of fluid, and wherein densification of the fiber fabric includes chemical vapor infiltration (CVI) of the matrix into said fiber fabric.

* * * * *